United States Patent
Takeshita et al.

(10) Patent No.: US 7,226,869 B2
(45) Date of Patent: Jun. 5, 2007

(54) METHODS FOR PROTECTING SILICON OR SILICON CARBIDE ELECTRODE SURFACES FROM MORPHOLOGICAL MODIFICATION DURING PLASMA ETCH PROCESSING

(75) Inventors: Kenji Takeshita, Fremont, CA (US); Tsuyoshi Aso, Tokyo (JP); Seiji Kawaguchi, San Jose, CA (US); Thomas McClard, Fremont, CA (US); Wan-Lin Chen, Sunnyvale, CA (US); Enrico Magni, Pleasanton, CA (US); Michael Kelly, Pleasanton, CA (US); Michelle Lupan, Danville, CA (US); Robert Hefty, Mountain View, CA (US)

(73) Assignee: Lam Research Corporation, Fremont, CA (US)

( * ) Notice: Subject to any disclaimer, the term of this patent is extended or adjusted under 35 U.S.C. 154(b) by 96 days.

(21) Appl. No.: 10/975,946

(22) Filed: Oct. 29, 2004

(65) Prior Publication Data
US 2006/0091104 A1    May 4, 2006

(51) Int. Cl.
*H01L 21/302* (2006.01)

(52) U.S. Cl. ............. 438/710; 438/711; 438/714; 438/694; 438/695; 438/706; 438/719; 427/534; 427/536; 427/490

(58) Field of Classification Search ............. 438/710, 438/711; 216/37, 58; 427/534, 536
See application file for complete search history.

(56) References Cited

U.S. PATENT DOCUMENTS

| | | | |
|---|---|---|---|
| 4,426,246 A | 1/1984 | Kravitz et al. | |
| 4,498,953 A | 2/1985 | Cook et al. | |
| 4,595,484 A | 6/1986 | Giammarco et al. | |
| 5,302,420 A * | 4/1994 | Nguyen et al. | 427/490 |
| 5,565,038 A | 10/1996 | Ashley | |
| 5,585,012 A | 12/1996 | Wu et al. | |
| 5,665,203 A | 9/1997 | Lee et al. | |
| 5,888,906 A | 3/1999 | Sandhu et al. | |
| 5,900,288 A | 5/1999 | Kuhman et al. | |
| 6,033,997 A | 3/2000 | Perng | |
| 6,090,304 A | 7/2000 | Zhu et al. | |
| 6,090,718 A | 7/2000 | Soga et al. | |
| 6,124,211 A | 9/2000 | Butterbaugh et al. | |
| 6,156,435 A * | 12/2000 | Gleason et al. | 428/422 |
| 6,162,367 A | 12/2000 | Tai et al. | |
| 6,194,325 B1 * | 2/2001 | Yang et al. | 438/740 |
| 6,290,779 B1 | 9/2001 | Saleh et al. | |

(Continued)

OTHER PUBLICATIONS

Ibbotson, D.E., et al. "Plasmaless dry etching of silicon with fluorine-containing compounds," J. Appl Phys 56 (10), Nov. 15, 1984, pp. 2939-2942.

(Continued)

*Primary Examiner*—Nadine Norton
*Assistant Examiner*—Maki Angadi
(74) *Attorney, Agent, or Firm*—Buchanan Ingersoll & Rooney PC

(57) ABSTRACT

Methods for forming a protective polymeric coating on a silicon or silicon-carbide electrode of a plasma processing chamber are provided. The polymeric coating provides protection to the underlying surface of the electrode with respect to exposure to constituents of plasma and gaseous reactants. The methods can be performed during a process of cleaning the chamber, or during a process for etching a semiconductor substrate in the chamber.

38 Claims, 3 Drawing Sheets

U.S. PATENT DOCUMENTS

| | | |
|---|---|---|
| 6,391,788 B1 | 5/2002 | Khan et al. |
| 6,394,104 B1 | 5/2002 | Chen et al. |
| 6,489,249 B1 | 12/2002 | Mathad et al. |
| 6,500,356 B2 | 12/2002 | Goto et al. |
| 6,503,842 B2 | 1/2003 | Sandhu et al. |
| 6,514,378 B1 | 2/2003 | Ni et al. |
| 6,527,911 B1 | 3/2003 | Yen et al. |
| 6,559,049 B2 | 5/2003 | Chen et al. |
| 6,635,185 B2 | 10/2003 | Demmin et al. |
| 6,730,600 B2 | 5/2004 | Layadi et al. |
| 6,776,851 B1 | 8/2004 | Singh et al. |
| 2003/0190814 A1 | 10/2003 | Kumar et al. |
| 2004/0002221 A1* | 1/2004 | O'Donnell et al. ......... 438/710 |
| 2004/0112294 A1 | 6/2004 | Allen et al. |

OTHER PUBLICATIONS

Ibbotson, D.E., et al. "Selective interhalogen etching of tantalum compounds and other semiconductor materials," Appl. Phys. Lett. 46 (8), Apr. 15, 1985, pp. 794-796.

Yaws, Carl L., *The Matheson Gas Data Book*, 7$^{th}$ edition, McGraw-Hill (2001).

International Search Report and Written Opinion dated Jun. 27, 2006 for PCT/US05/38373.

* cited by examiner

METHODS FOR PROTECTING SILICON OR SILICON CARBIDE ELECTRODE SURFACES FROM MORPHOLOGICAL MODIFICATION DURING PLASMA ETCH PROCESSING

BACKGROUND

During the manufacture of semiconductor-based products, such as integrated circuits, etching and/or deposition steps are used to build up or remove layers of material on a semiconductor substrate. A conventional etching procedure energizes process gas into a plasma state to plasma etch material on the semiconductor substrate.

Interior surfaces of plasma processing chambers can be modified as a result of the plasma processes that are run within them. Surface modification can occur due to the flux of energetic ions, photons and various neutral atoms and molecules that are generated by the plasma discharge, as well as various reactions attendant in the processing of semiconductor substrates.

SUMMARY

Methods for forming protective polymeric coatings on surfaces of parts exposed to the action of plasmas in plasma processing apparatuses are provided. A preferred embodiment of the methods comprises supplying a gas composition into a plasma processing chamber, which contains one or more parts of silicon or silicon carbide, and generating a plasma from the gas composition to form a polymeric coating on one or more of the parts.

In a preferred embodiment, the plasma processing chamber contains an electrode of silicon or silicon carbide and also a substrate support opposite the electrode. A polymer coating is formed on at least a portion of the plasma-exposed surface of the electrode by generating a plasma from the gas composition.

The gas composition used to form the protective polymeric coating preferably comprises at least one hydrocarbon, fluorocarbon and/or hydrofluorocarbon precursor that is capable of forming the polymeric coating on the silicon or silicon carbide electrode. Gas precursors of these gases can also be used. The polymeric coating preferably remains on the plasma-exposed electrode surface during the entire duration, or part of, the subsequent plasma etching of a semiconductor substrate in the plasma processing chamber.

Methods for forming protective polymeric coatings on plasma-exposed surfaces of electrodes of silicon or silicon carbide as part of chamber cleaning processes are also provided. A preferred embodiment of the methods comprises supplying an oxygen-containing cleaning gas composition into a plasma processing chamber, which does not contain a production wafer. The chamber contains a silicon or silicon carbide electrode having a surface exposed to plasma. One or more additional silicon and/or silicon carbide parts may also be present in the chamber. Such other parts may include, for example, focus rings and plasma confinement rings. The cleaning gas composition is energized into the plasma state to clean the interior of the chamber. Next, a coating gas composition is supplied into the chamber and energized to produce a plasma. A polymeric coating can be formed on a portion of, or on the entire, plasma-exposed surface of the electrode. The polymeric coating can be optionally formed on plasma-exposed surfaces of one or more other silicon and/or silicon carbide parts that may be contained in the chamber.

Preferred embodiments of methods for etching semiconductor substrates are also provided, which comprise supplying a coating gas composition into a plasma processing chamber containing an electrode of silicon or silicon carbide having a plasma-exposed surface, and a substrate support opposite the electrode. The coating gas composition is energized into the plasma state. A polymeric coating is formed on a portion of, or on the entire, plasma-exposed surface of the electrode. The coating can optionally also be formed on plasma-exposed surfaces of one or more other silicon or silicon carbide parts that may be contained in the chamber. Subsequently, a plasma is formed from an etching gas composition to etch a semiconductor substrate supported on a substrate support.

BRIEF DESCRIPTION OF THE DRAWING FIGURES

DETAILED DESCRIPTION OF PREFERRED EMBODIMENTS

Parallel-plate plasma processing chambers include an upper electrode and a lower electrode. The bottom surface of the upper electrode typically faces a substrate support on which a semiconductor substrate is supported during plasma processing. These types of plasma processing chambers are suitable for performing plasma etching processes of various materials, such as dielectric materials, provided on semiconductor substrates. During plasma etching processes, an etching gas is supplied into the plasma processing chamber and plasma is produced by supplying power to at least one of the electrodes. The processing conditions are chosen so that features are etched in materials of the semiconductor substrate.

The upper electrode of parallel-plate plasma processing chambers can be composed of silicon or silicon carbide, for example. It has been determined that the plasma-exposed surface of the upper electrode, including the bottom surface, can be morphologically modified by the flux of energetic ions, photons and various neutral atoms and molecules that are generated by the plasma discharge, and by various reactions that occur in the processing of semiconductor substrates. A "morphological change" of the plasma-exposed surface of the electrode is characterized by a change in its surface topography. The surface topography change is caused by the non-uniform removal of material across the surface, such as across the width (e.g., diameter) of the bottom surface of the upper electrode, that results in regions of the plasma-exposed surface having different topographies. The morphologically-modified surface has regions with micro-roughness as compared to non-modified surface regions. Other silicon and/or silicon carbide parts exposed to the plasma may also be subject to a similar morphology modification.

Figure 1:
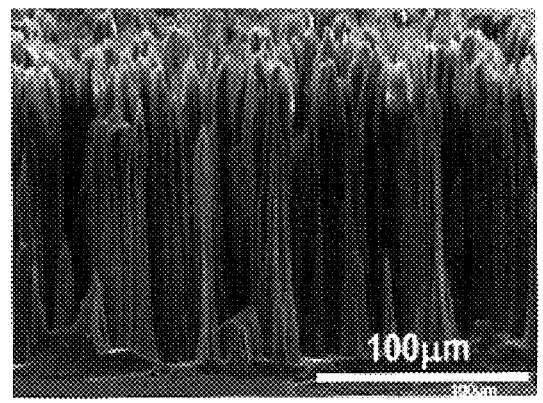
FIG. 1 shows a micrograph taken using a scanning electron microscope (SEM) of a morphologically-modified silicon electrode surface.
Figure 2:
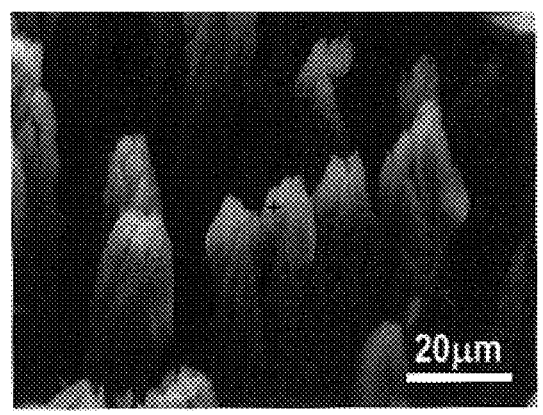
FIG. 2 shows an SEM micrograph taken at a higher magnification of the morphologically-modified electrode surface shown in FIG. 1.
Figure 3:
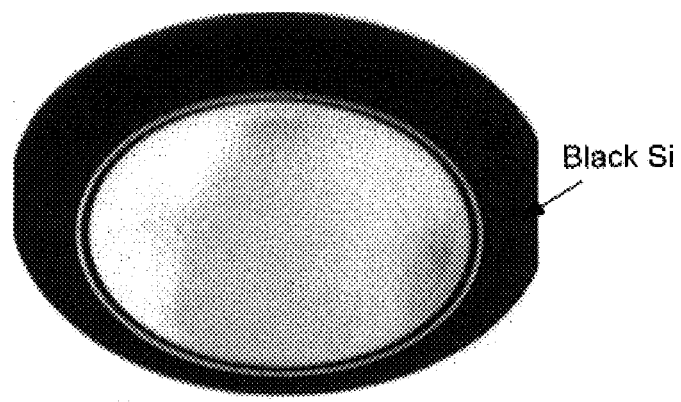
FIG. 3 shows a morphologically-modified surface of a silicon electrode.

As another example, a silicon electrode surface morphology change that is characterized by the presence of needle-like or rod-like micro-sized features has been found to result from certain plasma etching processes and process conditions used in a plasma processing chamber containing the electrode. FIGS. 1 and 2 show SEM micrographs of a morphologically-modified silicon surface including these micro features. FIG. 3 shows a black silicon formation at a peripheral region (extension surface) of a plasma-exposed bottom surface of a silicon upper electrode. As shown, the needle-like micro features are closely spaced. The features can typically have a length of from about 10 nm (0.01 µm) to about 50,000 nm (50 µm) (and in some instances can have a length as high as about 1 mm or even greater), and can typically have a width of from about 10 nm to about 50 µm.

Features, such as those shown in FIGS. 1–3, have been observed on silicon electrode surfaces, e.g., upper electrode surfaces, following, e.g., plasma etching processes of dielectric materials, such as silicon oxide and low-k dielectric materials, in the chamber. Conditions that have been found to be more favorable to the formation of these features include, for example, high $N_2$, low $O_2$ and low CF flow rates, and moderate RF power levels for generating plasma. The morphologically-modified surface can include one or more modified surface regions, e.g., a modified peripheral surface region and/or central surface region.

The modified surface morphology shown in FIGS. 1–3 is commonly referred to as "black silicon." "Black silicon" can form on a plasma-exposed silicon surface as a result of the surface being micro-masked by contaminants deposited on the surface during plasma processing operations. The micro-masked surface regions can be on the scale of from about 10 nm to about 10 microns. While not wishing to be bound to any particular theory, black silicon formation on the plasma-exposed surface of a silicon electrode (or other silicon part) is believed to occur as a result of non-contiguous polymer deposition on the silicon electrode during plasma processing operations. For example, a non-contiguous polymer deposit can form on the plasma-exposed surface, e.g., the bottom surface of a silicon upper electrode, during a main etching step for etching a dielectric material on a semiconductor substrate, such as silicon oxide or a low-k dielectric material layer. The polymer deposits typically form three-dimensional, island-like formations that selectively protect the underlying surface from etching. Once needle-like formations are formed, polymer deposits then form preferentially on the needle tips, thereby accelerating the micro-masking mechanism and black silicon propagation during the main etching step for successive substrates. The non-uniform, anisotropic etching (i.e., in the direction normal to the macroscopic bottom electrode surface) of the micro-masked surface region(s) results in the formation of closely-spaced, needle-like or rod-like features on the surface, such as these shown in FIGS. 1 and 2. These features can prevent light from reflecting from the modified regions of the silicon surface, which causes those regions to have a black appearance.

Figure 4:
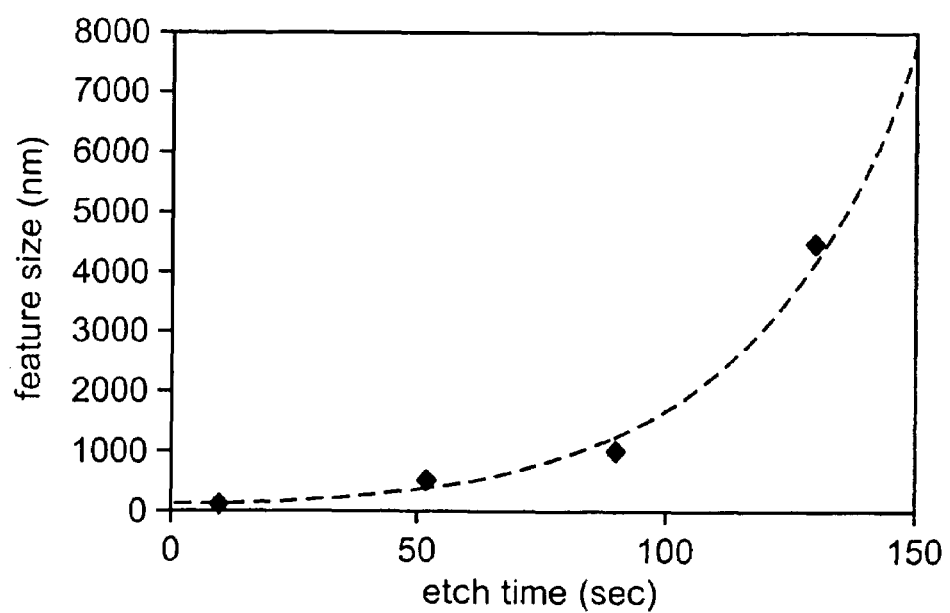
FIG. 4 shows a plot of the relationship between feature size (length) of black silicon and etching time.

It has also been determined that the length of the features shown in FIGS. 1 and 2 increases with respect to etching time, as shown in the plot in FIG. 4 for a typical low-k dielectric etching process.

In addition to the formation of black silicon on silicon, formations that are structurally similar to the characteristic formations of needle-like or rod-like features that produce a black appearance at modified surface regions of silicon can also form on silicon carbide. Such modified regions of a silicon carbide surface are referred to herein as "black silicon carbide." The morphology of the plasma-exposed surface of a silicon carbide electrode also can be modified by the flux of energetic ions, photons and various neutral atoms and molecules that are generated by the plasma discharge, and by various chemical reactions that occur in the processing of semiconductor substrates. Such plasma-induced damage and reactions can result in morphological changes of the modified surface of the silicon carbide electrode.

It is undesirable for black silicon or black silicon carbide to form on the plasma-exposed surface of an electrode of a parallel-plate (e.g., capacitively-coupled) plasma processing chamber because black silicon and black silicon carbide increase the plasma-exposed surface area of the surface. When the extent of the black silicon or black silicon carbide formation becomes "excessive," i.e., the modified surface area and/or the size of the features becomes excessive (e.g., exceeds a certain area or length), the black silicon or black silicon carbide can cause a process shift. Consequently, the plasma etching rate observed on the wafer can shift from wafer-to-wafer and/or across a wafer surface during single wafer processing of a batch of wafers in the processing chamber. For example, it has been found that the etch rate of a semiconductor substrate can be significantly lower (e.g., from about 10% to about 20% lower) at the surface regions of the semiconductor substrate that are closer to the regions of the electrode at which black silicon is present. Etch uniformity across the wafer can also be significantly degraded by the excessive formation of black silicon or black silicon carbide.

In light of the above-described problems that can result from morphological changes of a plasma-exposed surface of a silicon or silicon carbide electrode of a parallel-plate, e.g., a capacitively-coupled, plasma processing chamber, such as by reaction-related damage (e.g., excessive black silicon or black silicon carbide formation), or by bombardment-related damage, it is desirable to provide protection to the electrode with respect to such damage.

Accordingly, methods are provided that are performed in a plasma processing chamber containing a silicon or silicon carbide electrode prior to plasma etching a semiconductor substrate in the plasma processing chamber. The electrode is preferably an upper electrode of a capacitively-coupled plasma processing chamber. The electrode can be a new electrode (i.e., an electrode that has not been used for plasma processing), a refurbished electrode (i.e., an electrode that has been used for plasma processing in the same chamber or a different chamber and has been refurbished), or an electrode that has been used for plasma processing in the same chamber or a different chamber, but has not been refurbished. The electrode preferably does not include any black silicon or black silicon on the surface that is exposed to plasma, e.g., the bottom surface. However, the plasma-exposed electrode surface may have some level of black silicon or black silicon carbide, so long as it does not cause an undesirable process shift during the plasma etching of production wafers in the chamber.

The plasma etching process that is subsequently performed after the coating process is one that is capable of causing such morphological change to the plasma-exposed surface of the electrode without the polymeric coating. As a result of performing the methods, the coating provides protection to the plasma-exposed surface of the electrode with respect to such adverse morphological changes during the subsequently-performed plasma etching process.

More particularly, preferred embodiments of the methods comprise forming a protective polymeric coating on a plasma-exposed surface of a silicon or silicon carbide electrode of a plasma processing chamber, e.g., the upper electrode. In a preferred embodiment, the coating can be formed on the entire plasma-exposed surface, e.g., on the entire plasma-exposed bottom surface of an upper electrode.

In another preferred embodiment, the coating can be formed on a selected portion of the plasma-exposed surface of a silicon or silicon carbide electrode, e.g., over the peripheral surface region and/or central surface region of a plasma-exposed bottom surface of an upper electrode. For example, during some etching processes performed in a plasma processing chamber, black silicon or black silicon carbide may tend to form most prevalently at the peripheral surface region of the bottom surface of the upper silicon or silicon carbide electrode. Accordingly, in a preferred embodiment, the protective coating can be formed substantially over the peripheral surface region of the bottom surface of the electrode to provide protection against black silicon or black silicon carbide formation at the peripheral surface region during the subsequent plasma etching of a semiconductor substrate in the chamber.

Preferably, the protective coating, whether it is applied over an entire plasma-exposed surface or only a portion of the surface, protects the underlying surface of the silicon or silicon carbide electrode from the deposition on the electrode surface of polymer material (i.e., undesirable polymer material that is different from the polymeric material forming the protective coating) that can cause micro-masking of the surface(s) and initiate the formation of black silicon or black silicon carbide, and from bombardment-related damage. The polymeric coating formed on the plasma-exposed surface of the electrode provides protection against wear of the electrode surface.

In a preferred embodiment, the protective coating is formed on the entire plasma-exposed surface of the plasma processing chamber, including on the entire plasma-exposed surface of a silicon or silicon carbide electrode (e.g., the upper electrode). The coating can be formed as one step of a multi-step waferless auto clean process for cleaning the interior of a plasma processing chamber. In another preferred embodiment, the protective coating is formed on the entire plasma-exposed surface of the silicon or silicon carbide electrode (e.g., the upper electrode) as one of the steps of a semiconductor substrate etching process. Accordingly, the coating is present on the plasma-exposed surface of the silicon or silicon carbide electrode in the plasma processing chamber during a plasma etching process performed in the chamber after forming the coating. That is, the etching process is performed either after the waferless auto clean process, or as part of an etching step of the semiconductor substrate etching process that is performed after forming the coating. Preferably, the protective coating formed on the silicon or silicon carbide electrode has a sufficient thickness so that it remains on, and thereby covers, a portion of, or the entire, plasma-exposed surface of the electrode during the subsequent etching step.

The protective coating is formed on the silicon or silicon carbide upper electrode, and optionally on other parts, by energizing a suitable gas composition into the plasma state. The gas composition comprises at least one gas species that is capable of forming the polymeric coating on the upper electrode and other parts. Preferably, the gas composition comprises at least one gas selected from hydrocarbon, fluorocarbon and hydrofluorocarbon precursors that are capable of forming the polymeric coating on the silicon and/or silicon carbide of the parts. For example, the gas composition can comprise $C_2H_2$, $C_2H_4$, $C_3H_4$, $C_3H_6$, $C_4F_6$, $C_4F_8$, $CH_3F$, $CH_2F_2$ or mixtures thereof. Alternatively, a gas mixture that can be the precursor of one of the gases can be used. For example, $H_2/CO/CO_2$ gas mixtures can be used.

In a preferred embodiment, the gas composition also contains at least one rare gas (e.g., helium, argon or neon), $O_2$, $H_2$, $N_2$, CO, $CO_2$, or mixtures thereof. In a preferred embodiment, the gas composition contains $CH_3F$, $O_2$ and a rare gas (e.g., argon). In such gas compositions, the hydrocarbon, fluorocarbon and/or hydrofluorocarbon precursor, or precursors of these gases, can make up any suitable portion of the total gas composition, including a minor portion (i.e., less than 50% of the total gas composition flow), an equal portion, or a major portion (i.e., more than 50% of the total gas composition flow). Generally, decreasing the portion of the hydrocarbon, fluorocarbon and/or hydrofluorocarbon precursor, or precursors of these gases, in the gas composition decreases the rate of deposition of the protective polymeric coating on the plasma-exposed surface of the silicon or silicon carbide electrode.

The total flow of the gas composition is preferably sufficient to achieve a desired gas pressure in the plasma processing chamber during the polymer coating process. For example, the total gas flow of the gas composition can typically range from about 100 sccm to about 500 sccm. The chamber pressure can typically range from about 20 mT to about 1000 mT during the polymer coating process.

The polymer coating process is preferably conducted for a sufficient amount of time to form a protective polymeric coating having a sufficient thickness on the desired region(s) of the plasma-exposed surface of the silicon or silicon carbide electrode, and optionally of other parts, so that the coating remains on the as-coated plasma-exposed surface during the plasma etching of the semiconductor substrate. Also, the protective polymeric coating preferably forms a continuous coating over the desired region(s) of the plasma-exposed surface, e.g., peripheral region and/or central region of an electrode surface at which it is desired. By forming such sufficiently thick and continuous polymeric coatings, protection is provided against polymer micro-masking of the underlying plasma-exposed surface during subsequent semiconductor substrate plasma etching processes.

In a preferred embodiment, a protective polymeric coating is formed on a silicon or silicon carbide electrode, e.g., the upper electrode and optionally on one or more other parts, as one step of a multi-step process for cleaning interior surfaces of a plasma processing apparatus. The cleaning process is preferably a waferless auto clean process. The waferless auto clean process preferably includes a first step in which an oxygen plasma is generated to remove deposits from the interior surfaces. The oxygen plasma is preferably formed by energizing a gas composition containing $O_2$ into a plasma state without a production wafer (i.e., a wafer that is processed to produce a semiconductor-based product) being present in the plasma processing chamber. The polymer coating step is then performed after the first cleaning step. Preferably, the waferless auto clean process is performed prior to the etching of each production wafer in the plasma processing chamber.

Figure 5:
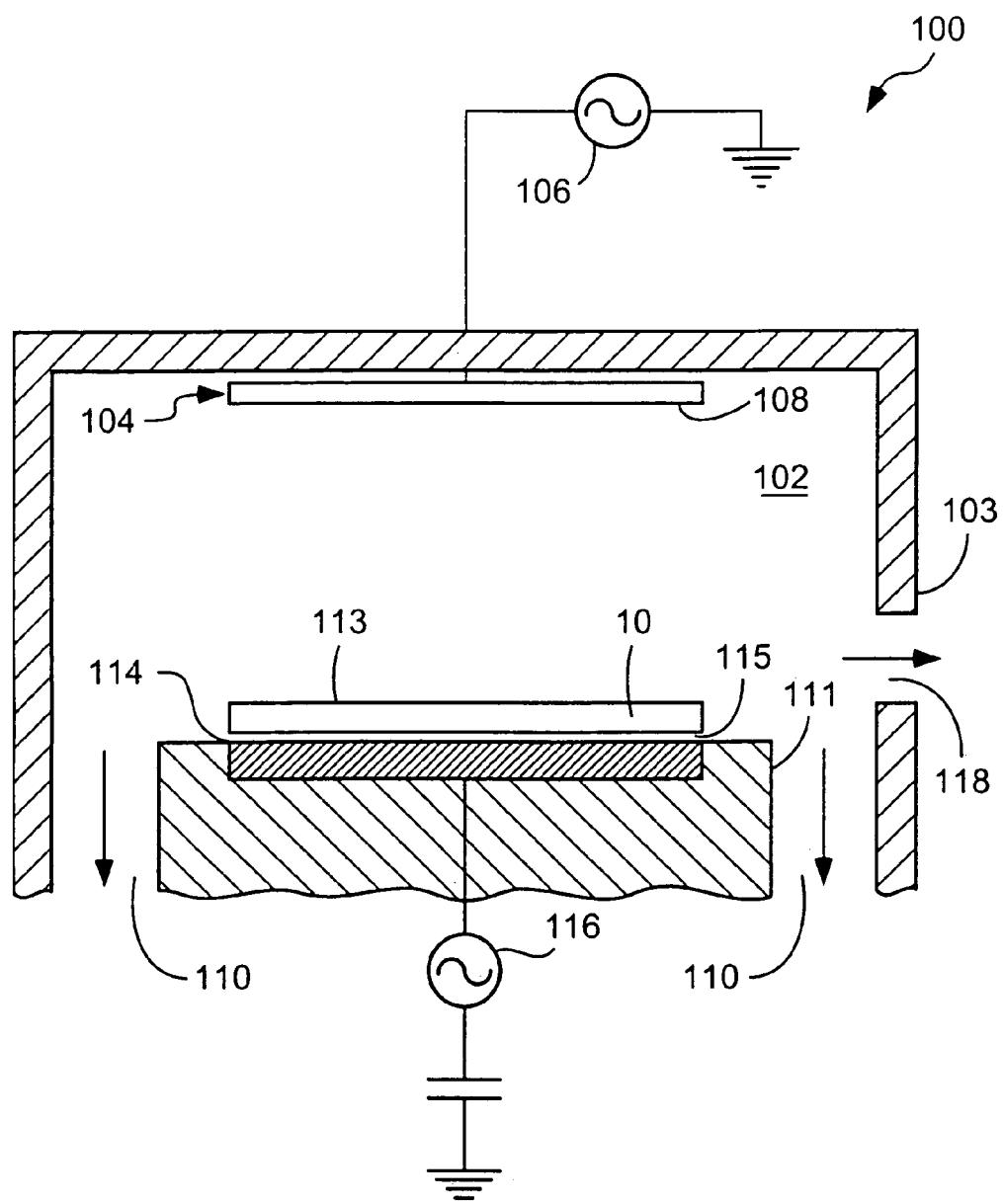
FIG. 5 shows an exemplary capacitively-coupled plasma processing apparatus that can be used to perform preferred embodiments of the methods described herein.

FIG. 5 depicts an exemplary plasma processing apparatus 100 that can be used to practice preferred embodiments of the methods described herein. The plasma processing apparatus 100 comprises a capacitively-coupled plasma processing chamber 102, which can generate a medium-density plasma. The plasma processing chamber 102 includes a chamber wall 103. To provide an electrical path to ground, the chamber wall 103 can be made of aluminum or the like and electrically grounded. The plasma processing chamber 102 includes a wafer transfer slot 118 provided in the chamber wall 103 to transfer semiconductor substrates into and out of the plasma processing chamber 102.

The plasma processing chamber 102 includes an upper electrode 104 having a bottom surface 108. The bottom surface 108 can be flat or can include a step, as described, for example, in U.S. Pat. No. 6,391,787, which is incorporated herein by reference in its entirety. The upper electrode 104 can be a single-piece, or multi-piece electrode. The upper electrode 104 can be a showerhead electrode including gas passages for distributing process gas into the plasma processing chamber. The upper electrode can be of silicon (e.g., single crystalline silicon or polycrystalline silicon) or silicon carbide. The apparatus 100 includes a gas source (not shown) for supplying process gas to the upper electrode 104. The upper electrode 104 is preferably powered by an RF power source 106 via a matching network. In another embodiment, the upper electrode 104 can be grounded to provide a return path for power supplied by a bottom electrode of the plasma processing chamber 102, as described below.

In the embodiment of the apparatus 100 shown in FIG. 1, process gas is supplied into the plasma processing chamber 102 at the plasma region developed between the upper electrode 104 and a semiconductor substrate 10, e.g., a semiconductor wafer, supported on a substrate support 111. The substrate support 111 preferably includes an electrostatic chuck 114 that secures the semiconductor substrate 10 on the substrate support by an electrostatic clamping force. The electrostatic chuck 114 acts as a bottom electrode and is preferably biased by an RF power source 116 (typically via a matching network). The upper surface 115 of the electrostatic chuck 114 preferably has approximately the same diameter as the semiconductor substrate 10.

A pump (not shown) is adapted to maintain a desired vacuum pressure inside the plasma processing chamber 102. Gas is drawn by the pump generally in the direction represented by arrows 110.

An exemplary parallel-plate plasma reactor that can be used is a dual-frequency plasma etch reactor (see, e.g., commonly-assigned U.S. Pat. No. 6,090,304, which is hereby incorporated by reference in its entirety). In such reactors, etching gas can be supplied to a showerhead electrode from a gas supply and a plasma can be generated in the reactor by supplying RF energy from two RF sources to the showerhead electrode and/or a bottom electrode, or the showerhead electrode can be electrically grounded and RF energy at two different frequencies can be supplied to the bottom electrode.

EXAMPLE 1

Twenty-five silicon wafers were subjected to a low-k dielectric main etch step to form vias in a capacitively-coupled plasma processing chamber, in which a silicon coupon was attached to the bottom surface of the silicon upper electrode. After etching the wafers using a first low-k main etch recipe, the bottom surface of the electrode was visually inspected, and the silicon coupon was examined by SEM. Black silicon formed on the electrode, and black silicon features having a needle length of about 500 nm were observed on the coupon.

The etching process was modified to incorporate a step of forming a protective polymer coating on the entire plasma-exposed bottom surface of a black silicon-free silicon upper electrode prior to performing the low-k main etch step using the first low-k main etch recipe. A silicon coupon was attached to the bottom surface of the electrode. After etching the wafers, the bottom surface of the electrode was visually inspected and the silicon coupon was analyzed by SEM; it was determined that no black silicon formed on the electrode.

EXAMPLE 2

The test procedures used in Example 1 were repeated using a second low-k main etch recipe. Black silicon formed on the bottom surface of the silicon upper electrode without the prior formation of the protective polymer coating on the bottom surface. In contrast, no black silicon formed on the electrode if cleaned and pre-conditioned to include a protective polymer coating.

EXAMPLE 3

Example 3 was performed to demonstrate the effect of forming a protective polymer layer on the entire plasma-exposed bottom surface of a silicon upper electrode of a capacitively-coupled plasma processing chamber during a waferless auto clean process before single wafer etching a batch of production wafers. A silicon coupon was attached to the bottom surface of the electrode. A batch of twenty-five silicon wafers were etched. Prior to subjecting each wafer to a low-k main etch step (using the second low-k main etch recipe), a waferless auto clean process was performed in the chamber. The waferless auto clean process included an oxygen plasma cleaning step using the following process conditions: chamber pressure of 500 mT/500 W at 27 MHz and 0 W at 2 MHz applied to lower electrode/2000 sccm $O_2$/90 sec. After etching the wafers, the bottom surface of the electrode was visually inspected, and the silicon coupon was examined by SEM. It was determined that black silicon formed on the electrode and coupon.

Next, the waferless auto clean process was modified to add, after the oxygen plasma cleaning step, a pre-conditioning step that formed a protective polymer coating on the silicon upper electrode, prior to performing the low-k main etch step (with the second low-k main etch recipe). A silicon coupon was attached to the bottom surface of the electrode. The following process conditions were used during the pre-conditioning step: chamber pressure of 300 mT/300 W at 27 MHz and 0 W at 2 MHz applied to lower electrode/25 sccm $O_2$/200 sccm $C_2H_4$/200 CO/10 sec. Following the etching of the silicon wafers, the bottom surface of the electrode was visually inspected and the silicon coupon was analyzed by SEM. It was determined that no black silicon formed on the electrode (or coupon).

EXAMPLE 4

Example 4 was also performed to demonstrate the effect of forming a protective polymer layer on a silicon upper electrode of a capacitively-coupled plasma processing chamber during a waferless auto clean process before the etching of each wafer. Twenty-five silicon wafers were etched. Prior to subjecting each wafer to a low-k main etch step, a waterless auto clean process was performed in the chamber in which a silicon coupon was attached to the bottom surface of the electrode. The waferless auto clean process included a first oxygen plasma cleaning step and a second step of forming a protective polymer layer on the entire plasma-exposed bottom surface of the electrode. The following process conditions were used during the first step: chamber pressure of 500 mT/750 W at 27 MHz and 0 W at 2 MHz applied to lower electrode/2000 sccm $O_2$/75 sec. The following process conditions were used during the second step: chamber pressure of 60 mT/800 W at 27 MHz and 200 W at 2 MHz applied to lower electrode/3.5 sccm $O_2$/50 sccm $CH_3F$/350 argon/4 sec. After etching the wafers, the bottom surface of the electrode was visually inspected, and the silicon coupon was examined by SEM. It was determined that no black silicon formed on the electrode (or coupon).

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of depositing a protective polymeric coating in a plasma processing chamber, the method comprising:
   supplying a gas composition into a plasma processing chamber which contains an electrode of silicon or silicon carbide which has a plasma-exposed surface, the electrode facing a substrate support for supporting a semiconductor substrate;
   energizing the gas composition into the plasma state; and
   forming a protective polymeric coating on at least a portion of the plasma-exposed surface of the electrode, the polymeric coating being capable of providing protection against etching of the surface underlying the protective coating during the subsequent plasma etching of the semiconductor substrate in the chamber.

2. The method of claim 1, wherein the gas composition comprises at least one gas selected from the group consisting of hydrocarbons, fluorocarbons, hydrofluorocarbons and precursors thereof capable of forming the polymeric coating on the plasma-exposed surface of the electrode.

3. The method of claim 1, wherein the gas composition comprises at least one gas selected from the group consisting of $C_2H_2$, $C_2H_4$, $C_3H_4$, $C_3H_6$, $C_4F_6$, $C_4F_8$, $CH_3F$, $CH_2F_2$ and mixtures thereof.

4. The method of claim 3, wherein the gas composition further comprises at least one gas selected from the group consisting of the rare gases, $O_2$, $H_2$, $N_2$, CO, $CO_2$ and mixtures thereof.

5. The method of claim 1, wherein the gas composition consists essentially of $CH_3F$, $O_2$ and a rare gas.

6. The method of claim 1, wherein the electrode is a showerhead electrode of single crystal silicon, polycrystalline silicon or silicon carbide.

7. The method of claim 1, wherein the polymeric coating formed on the plasma-exposed surface of the electrode has a sufficient thickness to remain on the plasma-exposed surface during the subsequent plasma etching of the semiconductor substrate in the plasma processing chamber.

8. The method of claim 1, wherein the gas composition is supplied into the plasma processing chamber at a flow rate of from about 100 sccm to about 500 sccm, and the plasma processing chamber is at a pressure of from about 20 mT to about 1000 mT.

9. The method of claim 1, wherein the polymeric coating is formed on the plasma-exposed surface of the electrode as part of a multi-step process of plasma cleaning interior surfaces of the plasma processing chamber.

10. The method of claim 1, wherein the polymeric coating is formed on the plasma-exposed surface of the electrode as part of a method of etching the semiconductor substrate in the plasma processing chamber.

11. The method of claim 1, wherein the gas composition is energized by capacitively-coupling power into the plasma processing chamber.

12. The method of claim 1, wherein the electrode is a new electrode, a refurbished electrode, or an electrode previously used in the chamber.

13. The method of claim 1, wherein the protective polymeric coating is formed on the entire plasma-exposed surface of the electrode.

14. The method of claim 1, wherein the plasma processing chamber contains at least one additional part that is of silicon or silicon carbide and has a plasma-exposed surface, and the protective polymeric coating is formed on the plasma-exposed surface of the at least one additional part.

15. A method of waferless autocleaning of a plasma processing chamber, comprising:
   supplying an oxygen-containing cleaning gas composition into a plasma processing chamber which does not contain a production wafer, the chamber contains an electrode of silicon or silicon carbide which has a plasma-exposed surface, the electrode facing a substrate support for supporting a semiconductor substrate;
   energizing the cleaning gas composition into the plasma state and cleaning the interior of the chamber;
   subsequently supplying a coating gas composition into the chamber;
   energizing the coating gas composition into the plasma state; and
   forming a polymeric coating on at least a portion of the plasma-exposed surface of the electrode, the polymeric coating provides protection against etching of the surface underlying the coating during the subsequent plasma etching of a semiconductor substrate in the chamber.

16. The method of claim 15, wherein the coating gas composition comprises at least one gas selected from the group consisting of hydrocarbons, fluorocarbons, hydrofluorocarbons and precursors thereof capable of forming the polymeric coating on the plasma-exposed surface of the electrode.

17. The method of claim 15, wherein the coating gas composition comprises at least one gas selected from the group consisting of $C_2H_2$, $C_2H_4$, $C_3H_4$, $C_3H_6$, $C_4F_6$, $C_4F_8$, $CH_3F$, $CH_2F_2$ and mixtures thereof.

18. The method of claim 17, wherein the coating gas composition further comprises at least one gas selected from the group consisting of the noble gases, $O_2$, $H_2$, $N_2$, CO, $CO_2$ and mixtures thereof.

19. The method of claim 15, wherein the coating gas composition consists essentially of $CH_3F$, $O_2$ and a rare gas.

20. The method of claim 15, wherein the electrode is a showerhead electrode of single crystal silicon, polycrystalline silicon or silicon carbide.

21. The method of claim 15, wherein the polymeric coating formed on the plasma-exposed surface of the electrode has a sufficient thickness to remain on the plasma-exposed surface during the subsequent plasma etching of a semiconductor substrate in the plasma processing chamber.

22. The method of claim 15, wherein the coating gas composition is supplied into the plasma processing chamber at a flow rate of from about 100 sccm to about 500 sccm, and the plasma processing chamber is at a pressure of from about 50 mT to about 1000 mT.

23. The method of claim 15, wherein the cleaning gas composition and the coating gas composition are energized by capacitively-coupling power into the plasma processing chamber.

24. The method of claim 15, wherein the electrode is a new electrode, a refurbished electrode, or an electrode previously used in the chamber.

25. The method of claim 15, wherein the protective polymeric coating is formed on the entire plasma-exposed surface of the electrode.

26. The method of claim 15, wherein the plasma processing chamber contains at least one additional part that is of silicon or silicon carbide and has a plasma-exposed surface, and the protective polymeric coating is formed on the plasma-exposed surface of the at least one additional part.

27. A method for etching a semiconductor substrate, comprising:
supplying a coating gas composition into a plasma processing chamber, the chamber contains an electrode of silicon or silicon carbide which has a plasma-exposed surface, the electrode facing a substrate support supporting a semiconductor substrate;
energizing the coating gas composition into the plasma state;
forming a polymeric coating on at least a portion of the plasma-exposed surface of the electrode;
subsequently supplying an etching gas composition into the chamber;
energizing the etching gas composition into the plasma state; and
plasma etching the semiconductor substrate;
wherein the polymeric coating remains on the plasma-exposed surface of the electrode during the plasma etching of the semiconductor substrate.

28. The method of claim 27, wherein the coating gas composition comprises at least one gas selected from the group consisting of hydrocarbons, fluorocarbons, hydrofluorocarbons and precursors thereof capable of forming the polymeric coating on the plasma-exposed surface of the electrode.

29. The method of claim 27, wherein the coating gas composition comprises at least one gas selected from the group consisting of $C_2H_2$, $C_2H_4$, $C_3H_4$, $C_3H_6$, $C_4F_6$, $C_4F_8$, $CH_3F$, $CH_2F_2$ and mixtures thereof.

30. The method of claim 29, wherein the coating gas composition further comprises at least one gas selected from the group consisting of the noble gases, $O_2$, $H_2$, $N_2$, $CO$, $CO_2$ and mixtures thereof.

31. The method of claim 27, wherein the coating gas composition consists essentially of $CH_3F$, $O_2$ and a rare gas.

32. The method of claim 27, wherein the electrode is a showerhead electrode of single crystal silicon or polycrystalline silicon.

33. The method of claim 27, wherein the plasma processing chamber is at a pressure of from about 20 mT to about 1000 mT, and the coating gas composition is supplied into the plasma processing chamber at a flow rate of from about 100 sccm to about 500 sccm.

34. The method of claim 27, wherein the coating gas composition and the etching gas composition are energized by capacitively-coupling power into the plasma processing chamber.

35. The method of claim 27, wherein the etching comprises etching a low-k dielectric material layer of the semiconductor substrate.

36. The method of claim 27, wherein the electrode is a new electrode, a refurbished electrode, or an electrode previously used in the chamber.

37. The method of claim 27, wherein the protective polymeric coating is formed on the entire plasma-exposed surface of the electrode.

38. The method of claim 27, wherein the plasma processing chamber contains at least one additional part that is of silicon or silicon carbide and has a plasma-exposed surface, and the protective polymeric coating is formed on the plasma-exposed surface of the at least one additional part.

* * * * *